(12) United States Patent
Kim et al.

(10) Patent No.: US 7,821,198 B2
(45) Date of Patent: Oct. 26, 2010

(54) ORGANIC LIGHT-EMITTING DIODE DISPLAY DEVICE AND METHOD OF FABRICATING THE SAME

(75) Inventors: Jeong Hyun Kim, Gyeonggi-do (KR); Jae Yoon Lee, Seoul (KR); Young Mi Kim, Incheon-si (KR); Kyeong Yun Bae, Gyeongsangnam-Do (KR)

(73) Assignee: LG Display Co., Ltd., Seoul (KR)

( * ) Notice: Subject to any disclaimer, the term of this patent is extended or adjusted under 35 U.S.C. 154(b) by 430 days.

(21) Appl. No.: 11/812,214

(22) Filed: Jun. 15, 2007

(65) Prior Publication Data

US 2008/0018245 A1 Jan. 24, 2008

(30) Foreign Application Priority Data

Jun. 30, 2006 (KR) ................. 10-2006-0061113

(51) Int. Cl.
H01J 1/62 (2006.01)
(52) U.S. Cl. ................. 313/505; 315/169.3
(58) Field of Classification Search ......... 313/498–512; 315/169.3, 169.4; 257/40, 79; 428/690
See application file for complete search history.

(56) References Cited

U.S. PATENT DOCUMENTS 7,187,118 B2  3/2007 Park et al.

| 2002/0003227 | A1* | 1/2002 | Kageyama et al. | 252/512 |
| 2003/0127972 | A1* | 7/2003 | Han et al. | 313/504 |
| 2004/0007974 | A1* | 1/2004 | Takamura | 313/512 |
| 2004/0014251 | A1* | 1/2004 | Park et al. | 438/22 |
| 2004/0080262 | A1  | 4/2004 | Park et al. | |
| 2005/0155706 | A1* | 7/2005 | Nishida et al. | 156/312 |
| 2005/0184650 | A1* | 8/2005 | Peng et al. | 313/503 |

FOREIGN PATENT DOCUMENTS

CN 1499909 A 5/2004

* cited by examiner

Primary Examiner—Peter Macchiarolo
(74) Attorney, Agent, or Firm—Birch, Stewart, Kolasch & Birch, LLP

(57) ABSTRACT

An organic light-emitting display device and a method of fabricating the same is disclosed, to prevent contact defects, the organic light-emitting display device comprising a first substrate formed a sub-pixel driving array; a second substrate formed an OLED array; a sealant to bond the first and second substrates to each other; and a conductive material deformed when bonding the first and second substrates to each other so as to electrically connect the sub-pixel driving array and the OLED array to each other, the conductive material formed on the sub-pixel driving array.

19 Claims, 6 Drawing Sheets

ORGANIC LIGHT-EMITTING DIODE DISPLAY DEVICE AND METHOD OF FABRICATING THE SAME

This application claims the benefit of Korean Patent Application No. 2006-61113 filed on Jun. 30, 2006, which is hereby incorporated by reference as if fully set forth herein.

BACKGROUND OF THE INVENTION

1. Field of the Invention

The present invention relates to an organic light-emitting diode (OLED) display device, and more particularly, to an OLED display device to prevent contact defects, and a method of fabricating the same.

2. Discussion of the Related Art

Among various display devices which represent information as images, an organic light-emitting display device has attracted great attentions owing to its thin profile corresponding to paper. The organic light-emitting display device using a thin organic light-emitting layer formed between electrodes emits light by itself, which is referred to as an electro-luminescence display device or an organic light-emitting diode display device (hereinafter, which is referred to as an OLED display device). The OLED display device has the advantageous properties of lower power consumption, thinner profile and greater self-light emission as compared to those of a liquid crystal display device.

The OLED display device is developing in an active matrix type which is suitable for displaying moving images to separately drive sub-pixels of red, green and blue colors included in one pixel. The active matrix OLED (AMOLED) display device includes a plurality of sub-pixels, wherein each of the sub-pixels is comprised of an OLED including the cathode, the anode and an organic light-emitting layer formed between the cathode and the anode; and a sub-pixel driver to drive the OLED independently. The sub-pixel driver includes at least two thin film transistors and a storage capacitor, wherein the sub-pixel driver controls the brightness of OLED based on a current amount supplied to the OLED. Also, the OLED includes a hole-injection layer, a hole-transport layer, a light-emitting layer, an electron-transport layer, and an electron-injection layer provided between the cathode and the anode and formed of an organic material. As a forward-directional voltage is applied between the cathode and the anode, electrons of the cathode are moved to the light-emitting layer through the electron-injection layer and the electron-transport layer. Also, holes of the anode are moved to the light-emitting layer through the hole-injection layer and the hole-transport layer. The light-emitting layer emits the light by recombination of the electrons supplied through the electron-transport layer and the holes supplied through the hole-transport layer. At this time, the brightness of emitted light is proportion to the current amount flowing between the cathode and the anode.

The related art AMOLED display device is formed in an encapsulation structure where a substrate including a sub-pixel driving array and an OLED array is bonded to a packaging plate, wherein the light is emitted through the substrate including the sub-pixel driving array and the OLED array. If defects occur in the process of OLED array after completing the process of sub-pixel driving array, the substrate is disused whereby the yield is lowered. Also, it is difficult to apply the packaging plate to a high-resolution display device since the packaging plate limits an aperture ratio.

In order to overcome these problems, there is a recent development for a dual-plate type AMOLED display device where sub-pixel driving array and OLED array are formed on different substrates. In the dual-plate type AMOLED display device, each sub-pixel driver is simply connected with an OLED by a spacer when bonding the different substrates to each other, whereby a contact portion between the sub-pixel driver and the OLED is unstable. Accordingly, open defects occur due to the unstable contact between the sub-pixel driver and the OLED if the substrate is deformed by the step difference of substrate, the ununiform thickness of spacer, the moisture or the external force.

SUMMARY OF THE INVENTION

Accordingly, the present invention is directed to an OLED display device and a method of fabricating the same that substantially obviates one or more problems due to limitations and disadvantages of the related art.

An object of the present invention is to provide an OLED display device to prevent contact defects, and a method of fabricating the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an OLED display device comprises a first substrate formed a sub-pixel driving array; a second substrate formed an OLED array; a sealant to bond the first and second substrates to each other; and a conductive material deformed when bonding the first and second substrates to each other so as to electrically connect the sub-pixel driving array and the OLED array to each other, the conductive material formed on the sub-pixel driving array. Also, the OLED display device of claim further comprises an organic insulation layer formed between the sub-pixel driving array and the conductive material, wherein the organic insulation layer has contact holes to expose the predetermined portions of electrodes on the first substrate. The organic insulation layer is provided at a predetermined interval from the sealant in an inner area of the first substrate sealed by the sealant.

The conductive material is comprised of conductive balls having the elastic properties and included in a conductive film. The conductive film corresponds to an anisotropic conducting film including the conductive ball and resin. Also, the conductive film additionally includes a getter material which absorbs moisture and gas. The conductive film is formed on an entire surface of the organic insulation layer, or is partially formed only on predetermined portions to electrically connect the first and second substrates to each other.

The conductive material includes the conductive balls of elastic properties inserted into the contact hole of first substrate.

The conductive material formed in the contact hole of first substrate is adhered to the sub-pixel driving array and the OLED array.

A method of fabricating the OLED display device comprises forming the sub-pixel driving arrayon the first substrate; forming the OLED array the second substrate; forming the conductive material on the sub-pixel driving array; and bonding the first and second substrates to each other by the sealant, and electrically connecting the sub-pixel driving array and the OLED array to each other by the deformed conductive material.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, OLED display devices according to the preferred embodiments of the present invention will be described with reference to FIGS. 1 to 6.

Figure 1:
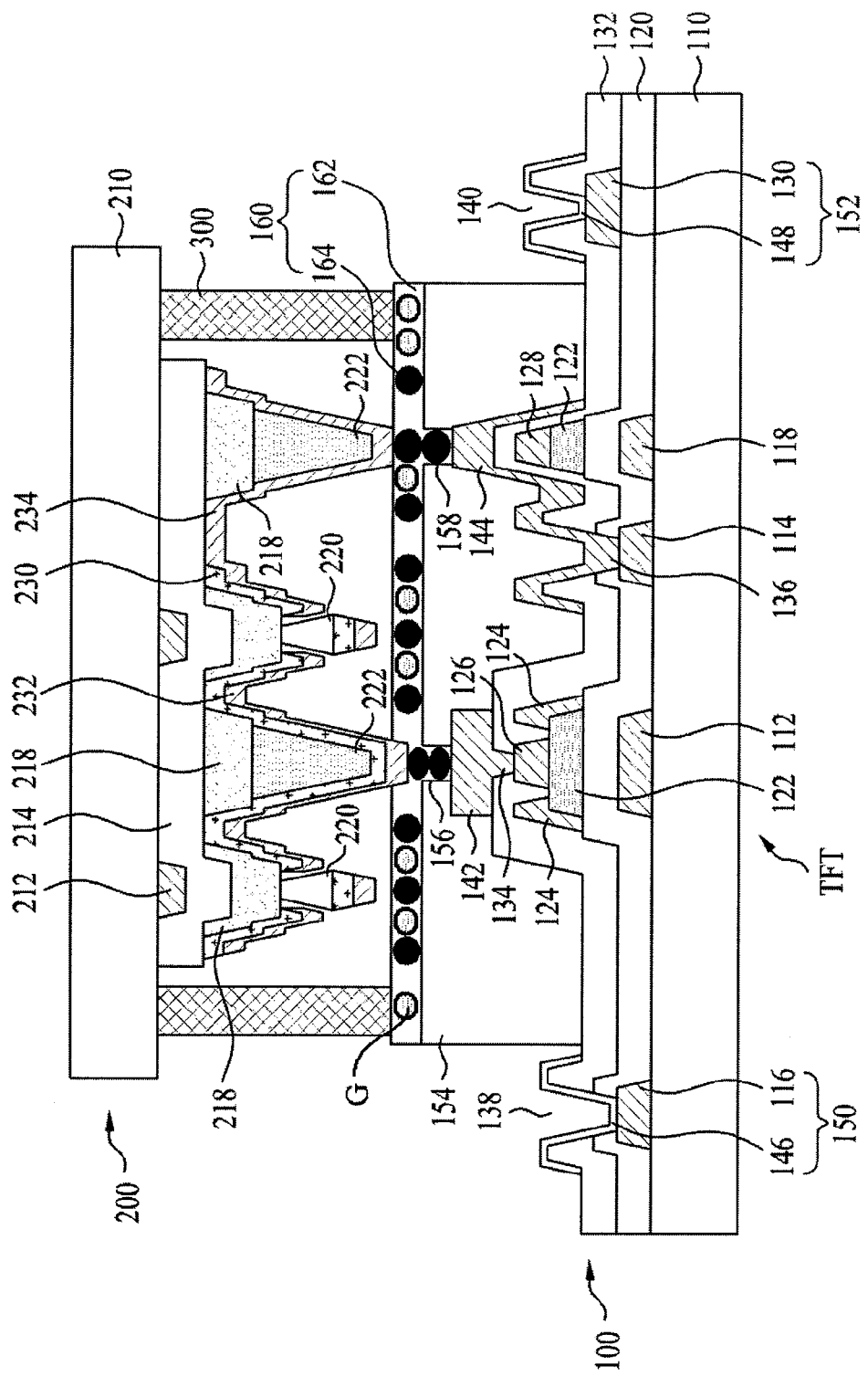
FIG. 1 is a cross section view of illustrating an OLED display device according to one preferred embodiment of the present invention.

FIG. 1 is a cross section view of illustrating an OLED display device according to one preferred embodiment of the present invention.

As shown in FIG. 1, the OLED display device according to one preferred embodiment of the present invention is comprised of a lower substrate 100 including a sub-pixel driving array; an upper substrate 200 including an OLED array; and a sealant 300 to bond the lower and upper substrates 100 and 200 to each other. The sub-pixel driving array includes a plurality of sub-pixel drivers to drive a plurality of sub-pixels provided in an image displaying part, and the OLED array includes a plurality of OLEDs for the sub-pixels.

The lower substrate 100 is comprised of the sub-pixel driving array including a plurality of signal lines and thin film transistors TFTs, the sub-pixel driving array formed on an insulation substrate 110; an organic insulation layer 154 to cover the sub-pixel driving array; and a conductive film 160 formed on the organic insulation layer 154. The lower substrate 100 is divided into an inner area and an outer area by the sealing portion of sealant 300. The sub-pixel driving array is positioned in the inner area of the lower substrate.

The sub-pixel driver formed in each sub-pixel includes two thin film transistors and one capacitor. For example, one of the two thin film transistors correspond to the switching thin film transistor which supplies a data signal outputted from a data line in response to a scan signal outputted from a gate line; and the other corresponds to the driving thin film transistor which controls a current of electricity through the OLED in response to the data signal outputted from the switching thin film transistor. The storage capacitor makes the constant current flowing through the driving thin film transistor even though the switching thin film transistor is turned off. In this sub-pixel driver, the thin film transistor of FIG. 2 corresponds to the driving thin film transistor connected with the OLED, and the switching thin film transistor is identical in cross-sectional structure to the driving thin film transistor, whereby the drawing of switching thin film transistor is omitted.

The thin film transistor shown in FIG. 1 includes a gate electrode 112 formed on the insulation substrate 110; a semiconductor layer 122 overlaping with the gate electrode 112 in state of interposing a gate insulation layer 120 therebetween; and source and drain electrodes 124 and 126 which use the semiconductor layer 122 as a channel. In addition, the thin film transistor includes an impurity semiconductor layer, that is, an ohmic contact layer (not shown) formed between the semiconductor layer 122 and the source and drain electrodes 124 and 126. The gate electrode 112 of driving thin film transistor is connected with a drain electrode (not shown) of switching thin film transistor, and the source electrode 124 of driving thin film transistor is connected with a second power-supplying line (not shown). The drain electrode 126 is connected with the OLED, that is, a first electrode 232 of the OLED formed on the upper substrate 200, through a first contact electrode 142 and the conductive film 160. At this time, the gate electrode (not shown) of switching thin film transistor is connected with the gate line (not shown), and the source electrode of switching thin film transistor is connected with the data line (not shown).

The first contact electrode 142 is connected with the drain electrode 126 through a contact hole 134 formed in a passivation layer 132 to protect the thin film transistor TFT. Also, the first contact electrode 142 is connected with a conductive ball included in the conductive film 160 through a contact hole 156 passing through the organic insulation layer 154.

A first power-supplying line 114 is formed together with the gate electrode 112 in the circumference of sub-pixel driving array within the inner area of the lower substrate 100 sealed by the sealant 300. A second contact electrode 144 is electrically connected with the first power-supplying line 114. The first power-supplying line 114 is electrically connected with a second electrode 214 of the OLED formed on the upper substrate 200 through the second contact electrode 144 and the conductive film 160 formed on the lower substrate and a third contact electrode 234 formed on the upper substrate 200.

The second contact electrode 144 is connected with the first power-supplying line 114 through the contact hole 136 formed in the passivation layer 132 and the gate insulation layer 120. Also, the second contact electrode 144 is connected with the conductive ball 164 included in the conductive film 160 through the contact hole 158 formed in the organic insulation layer 154. In order to bring the second contact electrode 144 and the first contact electrode 142 into the same height, there are a plurality of dummy patterns 118, 122 and 128 below the second contact electrode 144 connected with the conductive ball 164. For example, the plurality of dummy patterns 118, 122 and 128 include the dummy pattern 118 formed together with the gate electrode 112; the semiconductor layer 122 formed on the gate insulation layer 120; and the dummy pattern 128 formed together with the source and drain electrodes 124 and 126 under the passivation layer 132. In addition, an impurity semiconductor layer (not shown) may be formed between the semiconductor layer 122 and the dummy pattern 128.

In the outer area of the sealing portion formed by the sealant 300 of the lower substrate 100, there is a pad region including a gate pad 150 connected with the gate line (not shown) and a data pad 152 connected with the data line (not shown). The gate pad 150 includes a lower gate pad 116 which is formed together with the gate electrode 112 and is extended from the gate line; and an upper gate pad 146 which is connected with the lower gate pad 116 through a contact hole 138 formed in the passivation layer 132 and the gate insulation layer 120. The data pad 152 includes a lower data pad 130 which is formed together with the source and drain electrodes 124 and 126 and is extended from the data line; and an upper data pad 148 which is connected with the lower data pad 130 through a contact hole 140 formed in the passivation layer 132. The upper gate pad 146 and the upper data pad 148 are formed of transparent conductive layers.

The organic insulation layer 154 of flat upper surface is formed on the passivation layer 132 including the first and second contact electrodes 142 and 144. The organic insulation layer 154 includes the contact holes 156 and 158 to expose the predetermined portions of the first and second contact electrodes 142 and 144 respectively. In this case, the organic insulation layer 154 is not formed in the pad region, to thereby expose the gate pad 150 and the data pad 152.

The conductive film 160 is formed on the organic insulation layer 154. Also, the conductive balls 164 included in the conductive film 160 are respectively connected with the first and second contact electrodes 142 and 144 through the contact holes 156 and 158. The conductive film 160 is comprised of the conductive balls 164 having the elastic properties and resin 162. For example, the conductive balls 164 are formed by coating insulation balls having the elastic properties with conductive layers. The conductive balls 164 electrically connect the lower and upper substrates 100 and 200 to each other, and resin 162 functions as an adhesive between the lower and upper substrates 100 and 200. The conductive film 160 is formed of an anisotropic conducting film (ACF). Also, the conductive film 160 may include a getter material G which absorbs moisture and gas of oxygen provided from the external or generated in the inside. The getter material G is used of silica, calcium (Ca), barium (Ba), calcium oxide (CaO), barium oxide (BaO), or the others.

The upper substrate 200 includes the OLED array formed on an insulation substrate 210. The OLED array is comprised of a first electrode 232 connected with the sub-pixel driver of the lower substrate 100; a second electrode 214 connected with the second power-supplying line 114; and an organic light-emitting layer 230 formed between the first and second electrodes 232 and 214. The OLED array may be deteriorated due to moisture and gas. In this respect, the OLED array is formed in the inner area of the upper substrate 200 sealed by the sealant 300.

The second electrode 214 of OLED is formed on the insulation substrate 210, wherein the second electrode 214 is formed of a transparent conductive layer to transmit the light emitted from the organic light-emitting layer 230. The second electrode 214 is formed in shape of a plate including the OLED array. The second electrode 214 supplies the second power source provided through the second power-supplying line 114 to the OLED array in common. Then, an auxiliary electrode 212 is formed between the second electrode 214 and the insulation substrate 210, wherein the auxiliary electrode 212 of metal layer compensates for resistant elements of the transparent conductive layer. The auxiliary electrode 212 is formed in a non-emission area of the organic light-emitting layer 230.

A buffer layer 218 is formed on the second electrode 214, to form a light-emission area of the organic light-emitting layer 230 by each sub-pixel. The buffer layer 218 is formed in the non-emission area of the organic light-emitting layer 230. The light-emission areas of organic light-emitting layer 230 provided by the buffer layer 218 are arranged by a matrix configuration. In other words, the buffer layer 218 provides the portion for the OLED in each sub-pixel.

A separator 220 and a contact spacer 222 are formed on the buffer layer 218, wherein the separator 220 divides the organic light-emitting layer 230 and the first electrode 232 into sub-pixels, and the contact spacer 222 is relatively higher so as to connect the first electrode 232 with the lower substrate 100. The separator 220 is formed in shape of a wall to surround each sub-pixel. The contact spacer 222 is formed in shape of a pillar at the predetermined portion to electrically connect the lower and upper substrates 100 and 20 to each other, for example, the contact portion between each sub-pixel driver and the OLED.

In order to separate the organic light-emitting layer 230 from the first electrode 232, the side surface of the separator 220 is tapered in opposite to the contact spacer 222. That is, as the contact spacer 222 goes from its bottom being in contact with the buffer layer 218 to its end, the cross section area of contact spacer 222 is decreased gradually, whereby the contact spacer 222 has the forward slope. In the meantime, as the separator 220 goes from its bottom being in contact with the buffer layer 218 to its end, the cross section area of separator 220 is increased gradually, whereby the separator 220 has the reverse slope.

The organic light-emitting layer 230 is formed on the second electrode 214 formed the buffer layer 218, the separator 220 and the contact spacer 222. Then, the first electrode 232 is formed on the organic light-emitting layer 230. The organic light-emitting layer 230 and the first electrode 232 are divided into the sub-pixel units by the reverse slope of separator 220. The organic light-emitting layer 230 includes a hole-injection layer, a hole-transport layer, a light-emitting layer, an electron-transport layer and an electron-injection layer. The organic light-emitting layer 230 emits red, green and blue lights by each sub-pixel unit.

The first electrode 232 has such a height as to allow the lower and upper substrates 100 and 200 to be in contact with each other when bonding the lower substrate 100 to the upper substrate 200. The contact spacer 222 is aligned to the contact hole 156 which exposes the first contact electrode 142 of the lower substrate 100. Thus, the first electrode 232 of covering the contact spacer 222 is connected with the first contact electrode 142 through the conductive balls 164 of the lower substrate 100. As a result, the first electrode 232 of each sub-pixel is supplied with the driving signal outputted from the thin film transistor (TFT) through the first contact electrode 142 and the conductive balls 164.

The second electrode 214 of upper substrate 200 is extended to the circumstance of OLED array, so that the second power source signal from lower substrate 100 is supplied to the second electrode 214 of upper substrate 200 through the third contact electrode 234. In order to make the third contact electrode 234, connected with the second electrode 214, being as high as the first electrode 232 when the third contact electrode 234 is in contact with the conductive film 160 of lower substrate 100, the buffer layer 218 and the contact spacer 222 are formed between the second electrode 214 and the third contact electrode 234. The buffer layer 218 and the contact spacer 222 are aligned to the contact hole 158 which exposes the second contact electrode 144 of lower substrate 100. Accordingly, the third contact electrode 234 of covering the buffer layer 218 and the contact spacer 222 is electrically connected with the second contact electrode 142 through the conductive balls 164 of lower substrate when bonding the lower and upper substrates 100 and 200 to each other. As a result, the second electrode 214 is supplied with the second power source signal provided from the second power-supplying line 114 through the second contact electrode 142, the conductive balls 164 and the third contact electrode 234. The third contact electrode 234 is formed together with the first electrode 232. The third contact electrode 234 is separated from the first electrode 232 by the separator 220.

The first power-supplying line (not shown) of lower substrate 100 supplies the power source signal of any one of the driving voltage (VDD) and ground voltage (GND) to the source electrode 124 of the thin film transistor TFT; and the second power-supplying line supplies the power source signal of the other to the source electrode 124. Accordingly, the first electrode 232 of OLED array formed on the upper substrate 200 is used as any one of the cathode and the anode; and the second electrode 214 is used as the other.

The sealant 300 is formed in the sealing portion of the lower or upper substrate 100 or 200, to thereby bond the lower and upper substrates 100 and 200 to each other. The sealant 300 is cured by ultraviolet rays. At this time, the sealant 300 is adhered to the insulation substrate 210 of upper substrate 200, and is also adhered to the conductive film 160 or organic insulation layer 154 of lower substrate 100.

The lower substrate 100 including the sub-pixel driving array is bonded to the upper substrate 200 including the OLED array. When bonding the lower and upper substrates 100 and 200, heat and pressure are applied thereto. Thus, the lower and upper substrates 100 and 200 are electrically connected to each other by the conductive film 160, and are stably cohered to each other by the applied heat and pressure. At this time, the resin 162 and conductive balls 164 of conductive film 160 have the elastic properties. Accordingly, the conductive film 160 of lower substrate 100 is pressed down on the portion being in contact with the contact spacer 222 of upper substrate 200 by the pressure applied when bonding the lower and upper substrates 100 and 200 to each other, thereby deforming the conductive balls 164 positioned corresponding to the contact holes 156 and 158 of lower substrate 100. Through the deformed conductive balls 164, the second electrode 232 formed on the contact spacer 222 and the third contact electrode 234 are respectively connected with the first contact electrode 142 and the second contact electrode 144 formed on the lower substrate 100. Thus, the conductive film 160 having the elastic properties compensates for the ununiform height of contact spacer 222, so that the lower and upper substrates 100 and 200 are electrically connected with each other with stableness. Also, the conductive film 160 further includes a getter material which absorbs moisture and gas of oxygen provided from the external or generated in the inside, to thereby prolong the lifespan of organic light-emitting layer 230 by preventing the deterioration of organic light-emitting layer 230.

Figure 2:
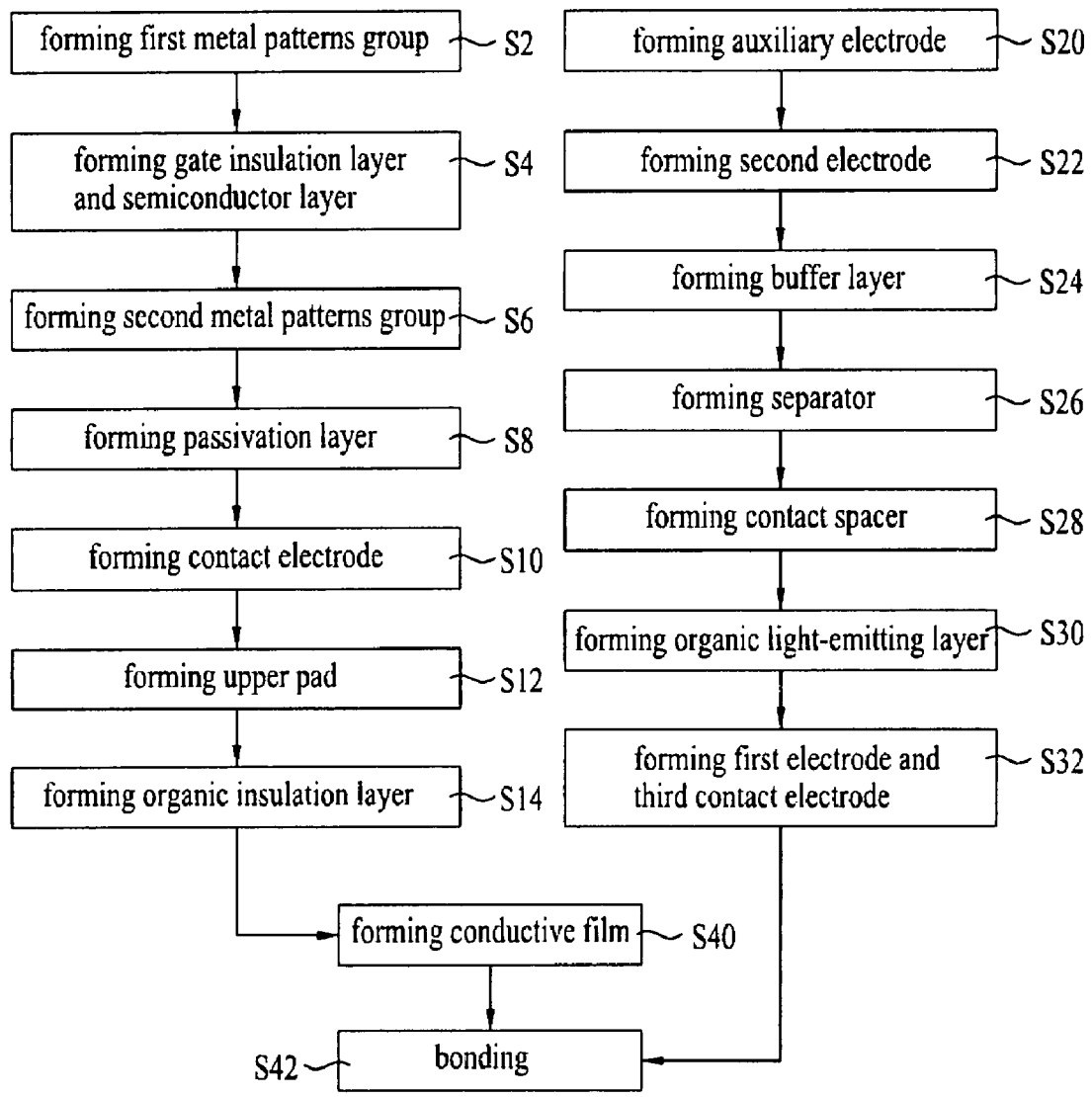
FIG. 2 is a flowchart of illustrating a method of fabricating an OLED display device according one preferred embodiment of the present invention.

FIG. 2 is a flowchart of illustrating a method of fabricating an OLED display device according one preferred embodiment of the present invention.

In the step 2 (S2), a first metal patterns group is formed on the insulating substrate 110 of lower substrate 100, wherein the first metal patterns group includes the gate line (not shown), the gate electrode 112, the second power-supplying line 114, the dummy pattern 118 and the lower gate pad 116. In detail, a first metal layer is deposited on the insulating substrate 110 by sputtering, and is then patterned by photolithography and etching, thereby forming the first metal patterns group. The first metal layer is formed of molybdenum (Mo), titanium (Ti), copper (Cu), aluminum (Al), chrome (Cr) or alloy thereof, wherein the first metal layer may be formed in a single-layered structure or multi-layered structure.

In the step 4 (S4), the gate insulation layer 120 is formed on the insulating substrate 110 formed the first metal patterns group. Thereon, the semiconductor layer 122 and the impurity semiconductor layer (not shown) are deposited in sequence. In detail, the gate insulation layer 120, the semiconductor layer 122 and the impurity semiconductor layer are deposited by PECVD (Plasma Enhanced Chemical Vapor Deposition). The gate insulation layer 120 is formed of an inorganic insulation material of silicon nitride ($SiN_x$) or silicon oxide ($SiO_x$). The semiconductor layer 122 is formed of an amorphous silicon layer (a-Si), and the impurity semiconductor layer is formed of a silicon layer doped with $n^+$ ions. Then, the impurity semiconductor layer and the semiconductor layer 122 are patterned by photolithography and etching, whereby the semiconductor layer 122 and the impurity semiconductor layer are partially left on the gate insulation layer 120.

In the step 6 (S6), a second metal patterns group is formed on the gate insulation layer 120 formed the semiconductor layer 122, wherein the second metal patterns group includes the data line (not shown), the first power-supplying line (not shown), the source electrode 124, the drain electrode 126, the dummy pattern 128 and the lower data pad 130. In detail, a second metal layer is deposited by sputtering, and is then patterned by photolithography and etching, thereby forming the second metal patterns group. Then, the exposed portion of impurity semiconductor layer is removed by the etching process using the source and drain electrodes 124 and 126 as a mask. The second metal layer is formed of molybdenum (Mo), titanium (Ti), copper (Cu), aluminum (Al), chrome (Cr) or an alloy thereof, wherein the second metal layer may be formed in a single-layered structure or multi-layered structure. In the meantime, the semiconductor layer 122, the impurity semiconductor layer and the second metal patterns group may be formed by one mask process using a diffraction exposure mask of diffraction exposure or a half-tone mask of semi-transmittance.

In the step 8 (S8), the passivation layer 132 including the plurality of contact holes 134, 136, 138 and 140 is formed on the gate insulation layer 120 including the second metal patterns group. The passivation layer 132 may be formed on the gate insulation layer 120 formed the second metal patterns group by CVD. Then, the passivation layer 132 is patterned by photolithography and etching, thereby forming the contact hole 134 to expose the predetermined portion of drain electrode 126, the contact hole 136 to expose the predetermined portion of second power-supplying line 114 through the gate insulation layer 120, the contact hole 138 to expose the lower gate pad 116, and the contact hole 140 to expose the lower data pad 130. The passivation layer 132 is formed of the inorganic insulation material of silicon nitride ($SiN_x$) or silicon oxide ($SiO_x$). On the other hand, the passivation layer 132 may be formed of an organic insulation material by a spin coating method or a spinless coating method.

In the step 10 (S10), the first and second contact electrodes 142 and 144 are formed on the passivation layer 132. In order to form the first and second contact electrodes 142 and 144, a third metal layer is deposited on the passivation layer 132 by sputtering, and is then patterned by photolithography and etching. The first contact electrode 142 is connected with the drain electrode 126 of thin film transistor TFT through the contact hole 134, and the second contact electrode 144 is connected with the second power-supplying line 114 through the contact hole 136. The third metal layer is formed of molybdenum (Mo), titanium (Ti), copper (Cu), aluminum (Al), chrome (Cr) or an alloy thereof, wherein the first metal layer may be formed in a single-layered structure or multi-layered structure.

In the step 12 (S12), the upper gate pad 146 is formed on the surface of contact hole 138 above the passivation layer 132, and the lower gate pad 148 is formed on the surface of contact hole 140 above the passivation layer 132. In order to form the upper gate pad 146 and the upper data pad 148, a transparent conductive layer is deposited on the passivation layer 132 by sputtering, and is then patterned by photolithography and etching. The upper gate pad 146 is connected with the lower gate pad 116 through the contact hole 138, and the upper data pad 148 is connected with the lower data pad 130 through the contact hole 140. The transparent conductive layer is formed of ITO (Indium Tin Oxide), TO (Tin Oxide), IZO (Indium Zinc Oxide) or ITZO (Indium Tin Zinc Oxide).

In the step of 14 (S14), the organic insulation layer 154 including the contact holes 156 and 158 is formed on the passivation layer 132 formed the first and second contact electrodes 142 and 144. The organic insulation layer 154 is formed on the passivation layer 132 by a spin coating method or a spinless coating method. Then, the organic insulation layer 154 is patterned by photolithography and etching, whereby the contact holes 156 and 158 penetrate through the organic insulation layer 154. The contact holes 156 and 158 having the same height expose the predetermined portions of first and second contact electrodes 142 and 144 respectively. In the meantime, the organic insulation layer 154 may be formed on the passivation layer 132 before forming the upper gate pad 146 and the upper data pad 148.

The lower substrate 100 of FIG. 1 is completed through the steps 2 to 14 (S2 to S14). At this time, the conductive film 160 of lower substrate 100 shown in FIG. 1 is formed before bonding the lower and upper substrates 100 and 200, and thus the conductive fill 160 is explained as follows.

In the step 20 (S20), the auxiliary electrode 212 is formed on the insulation substrate 210 of upper substrate 200. To form the auxiliary electrode 212, a metal layer is deposited on the insulation substrate 210 by sputtering, and is then patterned by photolithography and etching. The metal layer for the auxiliary electrode 212 is used of molybdenum (Mo), titanium (Ti), copper (Cu), aluminum (Al), chrome (Cr) or an alloy thereof, wherein the auxiliary electrode 212 may be formed in a single-layered structure or multi-layered structure.

In the step 22 (S22), the second electrode 214 is formed on the insulating substrate 210 formed the auxiliary electrode 212. To form the second electrode 214, a transparent conductive layer is deposited on the insulating substrate 210 formed the auxiliary electrode 212, and is then patterned by photolithography and etching. The transparent conductive layer may be used of ITO (Indium Tin Oxide), TO (Tin Oxide), IZO (Indium Zinc Oxide) or ITZO (Indium Tin Zinc Oxide).

In the step 24 (S24), the buffer layer 218 is formed on the second electrode 214. To form the buffer layer 218, an insulation layer is deposited on the second electrode 214 by PECVD, and is then patterned by photolithography and etching. The buffer layer 218 may be formed of the inorganic insulation material of silicon nitride ($SiN_x$) or silicon oxide ($SiO_x$). On the other hand, the passivation layer 132 may be formed of an organic insulation material by a spin coating method or a spinless coating method.

In the step 26 (S22), the separator 220 is formed on the buffer layer 218. To form the separator 220, an organic insulation material is coated on the buffer layer 218 by a spin coating method or a spinless coating method, and is then patterned by photolithography and etching, whereby the separator 220 has the reverse slope.

In the step 28 (S28), the contact spacer 222 is formed on the buffer layer 218. To form the contact spacer 222, an organic insulation material is coated on the buffer layer 218 by a spin coating method or a spinless coating method, and is then patterned by photolithography and etching. In the meantime, the contact spacer 222 may be formed on the buffer layer 218 before forming the separator 220.

In the step 30 (S30), the organic light-emitting layer 230 is formed on the second electrode 214 formed the contact spacer 222, the separator 220 and the buffer layer 218. The organic light-emitting layer 230 is sequentially formed in the corresponding portions of red, green and blue by the repeated deposition process using a shadow mask. The organic light-emitting layer 230 is divided into the sub-pixel units by the separator 220.

In the step 32 (S32), the first electrode 232 is formed on the organic light-emitting layer 230, and the third contact electrode 234 is formed on the first electrode 232. To form the first electrode 232 and the third contact electrode 234, a metal material is deposited on the organic light-emitting layer 230 by a thermal evaporation. The first electrode 232 is divided into the sub-pixel units by the separator 220. Also, the third contact electrode 234 is separated from the first electrode 232 by the separator 220. The first electrode 232 and the third contact electrode 234 may be formed of Al, MgAg, Ca or Ba.

Through the steps 20 to 32 (S20 to S32), the upper substrate 200 of FIG. 1 is completed.

In the step 40 (S40), the conductive film 160 is formed on the lower substrate 100 formed the organic insulation layer 154. At this time, the conductive film 160 from which a protection film is removed may be adhered to the organic insulation layer 154, or resin 162 holding the conductive balls 164 may be printed through the mask. Also, the conductive film 160 includes the getter material which absorbs the moisture and gas.

In the step 42 (S42), the sealant 300 is formed on the lower substrate 100, and the upper substrate 200 is positioned in opposite to the lower substrate 100. Then, the lower and upper substrates 100 and 200 are bonded to each other by vacuum. At this time, the conductive film 160 of lower substrate 100 is pressed down on the portion being in contact with the contact spacer 222 of upper substrate 200 by the pressure applied when bonding the lower and upper substrates 100 and 200 to each other, thereby deforming the conductive balls 164 positioned corresponding to the contact holes 156 and 158 of lower substrate 100. Through the deformed conductive balls 164, the second electrode 232 formed on the contact spacer 222 and the third contact electrode 234 are respectively connected with the first contact electrode 142 and the second contact electrode 144 formed on the lower substrate 100. At this time, the conductive film 160 having the elastic properties compensates for the ununiform height of contact spacer 222, so that the lower and upper substrates 100 and 200 are electrically connected with each other with stableness, thereby preventing the open defects. Also, the conductive film 160 further includes the getter material which absorbs moisture and gas of oxygen provided from the external or generated in the inside, to thereby prevent the organic light-emitting layer 230 from being deteriorated.

Figure 3:
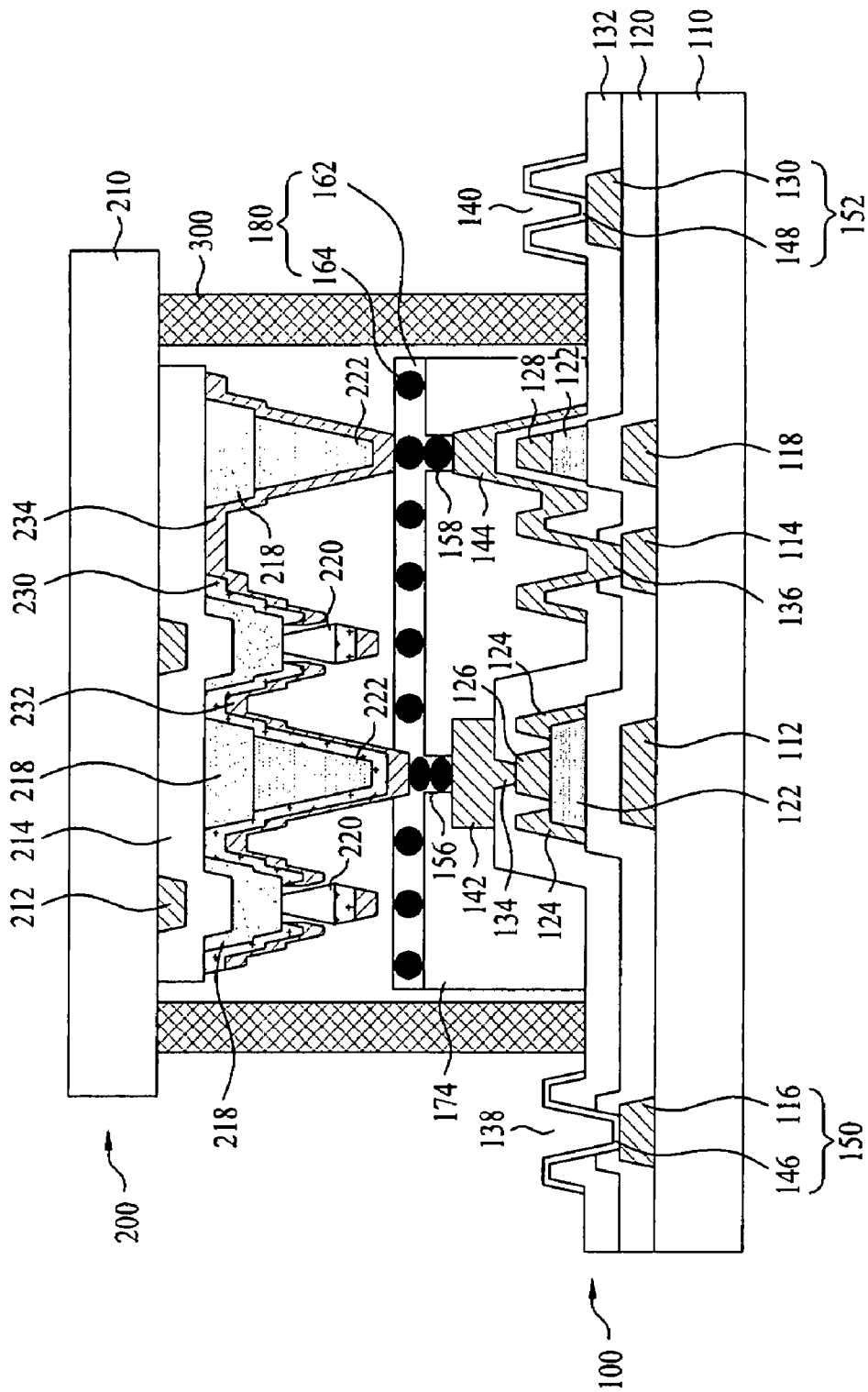
FIG. 3 is a cross section view of illustrating an OLED display device according to another preferred embodiment of the present invention.

FIG. 3 is a cross section view of illustrating an OLED display device according to another preferred embodiment of the present invention.

The OLED display device of FIG. 3 is identical in structure to the OLED display device of FIG. 1 except that an organic insulation layer 174 and a conductive film 180 are formed only in an inner area of sealing portion formed a sealant 300. Accordingly, the explanation of elements described in FIG. 1 will be omitted.

On the lower substrate 100, the organic insulation layer 174 and the conductive film 180 are positioned in the inner area of sealing portion formed the sealant 300. Accordingly, the sealant 300 is adhered to a passivation layer 132 of an inorganic insulation material, which has better adhesiveness as compared with adhering the conductive film 160 to the protection film or organic insulation layer 154 shown in FIG. 1. As a result, it is possible to prevent moisture from permeating into the inner area of sealing portion through the interface between the sealant 300 and the lower substrate 100 and the interface between the sealant 300 and the upper substrate 200.

Figure 4:
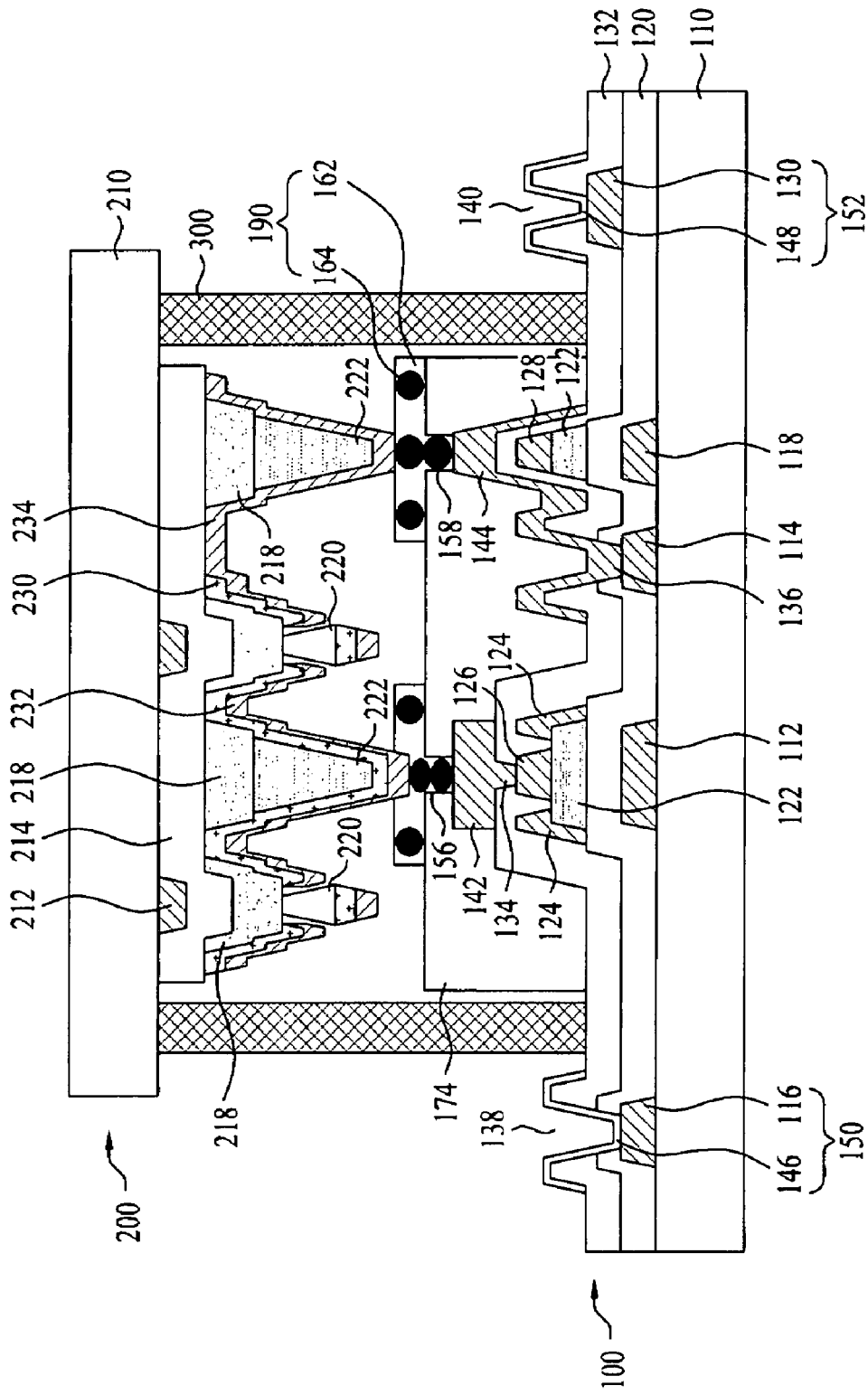
FIG. 4 is a cross section view of illustrating an OLED display device according to a third preferred embodiment of the present invention.

FIG. 4 is a cross section view of illustrating an OLED display device according to a third preferred embodiment of the present invention.

The OLED display device of FIG. 4 is identical in structure to the OLED display device of FIG. 3 except that a conductive film 190 is partially formed only on predetermined portions to electrically connect lower and upper substrates 100 and 200 to each other. Accordingly, the explanation of elements described in FIGS. 1 and 3 will be omitted.

As shown in FIG. 4, the conductive film 190 is partially formed only on the predetermined portions to electrically connect the lower and upper substrates 100 and 200 to each other. That is, the conductive film 190 is formed on the lower substrate 100 corresponding to contact holes to expose first and second contact electrodes 142 and 144. For example, the conductive film 190 may be independently provided on the sub-pixel driver of each sub-pixel, or may be provided in shape of a line passing through the plurality of sub-pixel drivers. Also, the conductive film 190 may be independently formed only on the portion of second contact electrode 144 in the circumference of sub-pixel driver, or may be formed in shape of a line passing through the plurality of second contact electrodes 144.

The conductive film 190 may be formed by a mask printing method, or by processing and adhering the conductive film 190 covered with the protection film. According as the conductive film 190 is partially formed only on the predetermined portions to electrically connect the lower and upper substrates 100 and 200 to each other, it is possible to prevent the conductive film 190 from being wasted unnecessarily.

Figure 5:
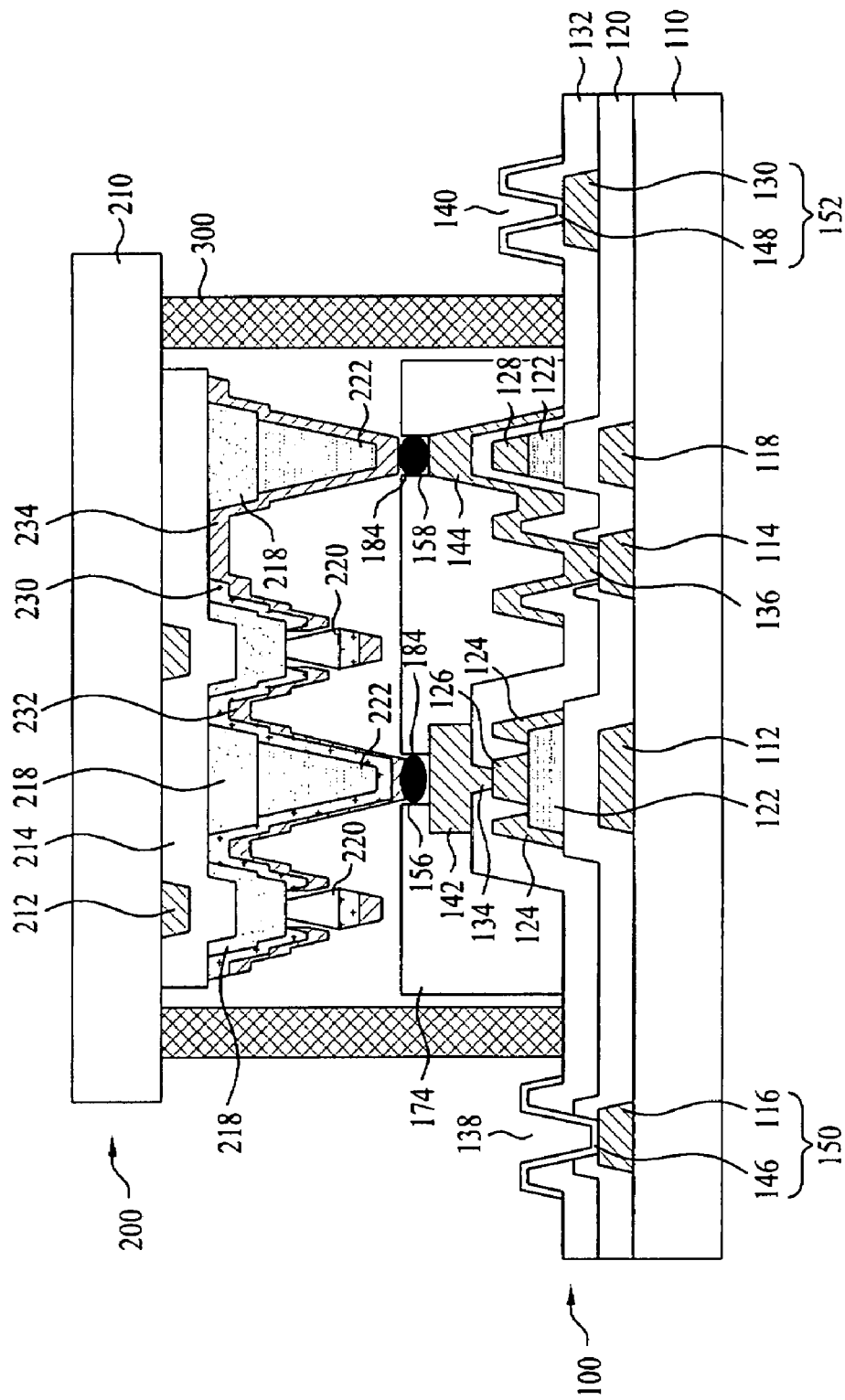
FIG. 5 is a cross section view of illustrating an OLED display device according to a fourth preferred embodiment of the present invention.

FIG. 5 is a cross section view of illustrating an OLED display device according to a fourth preferred embodiment of the present invention.

The OLED display device of FIG. 5 is identical in structure to the OLED display device of FIG. 3 except that conductive balls 184 having the elastic properties are provided only on predetermined portions required to electrically connect lower and upper substrates 100 and 200 to each other. Accordingly, the explanation of elements described in FIGS. 1 and 3 will be omitted.

As shown in FIG. 5, the conductive balls 184 are inserted into contact holes 156 and 58 to expose first and second contact electrodes 142 and 144 of lower substrate 100. In detail, a solution including the conductive balls 184 is dropped on the lower substrate 100, and then the lower substrate 100 is swinged, whereby the conductive balls 184 are inserted into the contact holes 156 and 158 of organic insulation layer 154. At least one of the conductive balls 156 is sufficiently small so that the conductive ball 155 is inserted into the contact holes 156 and 158, wherein each of the conductive balls 156 has a diameter of several micrometers ($\mu m$). In addition, the size of conductive ball is suitable for being stably fixed in the contact hole. Through the conductive ball 184 inserted into the contact hole 145, the second electrode 231 of upper substrate 200 is electrically connected with the first contact electrode 142 of lower substrate 100. Also, the other conductive ball 184 having the elastic properties inserted into the contact hole 158 electrically connects the third contact electrode 234 of upper substrate 200 with the second contact electrode 144 of lower substrate 100.

For example, in order to make the conductive ball 184 elastic, an outer surface of insulation ball having the elastic properties is coated with a conductive film. Accordingly, the conductive ball 184 is deformed due to the force applied to the upper substrate 100 so that the deformed conductive ball 184 compensates for the height difference of contact spacer 222, thereby preventing the open defects.

Figure 6:
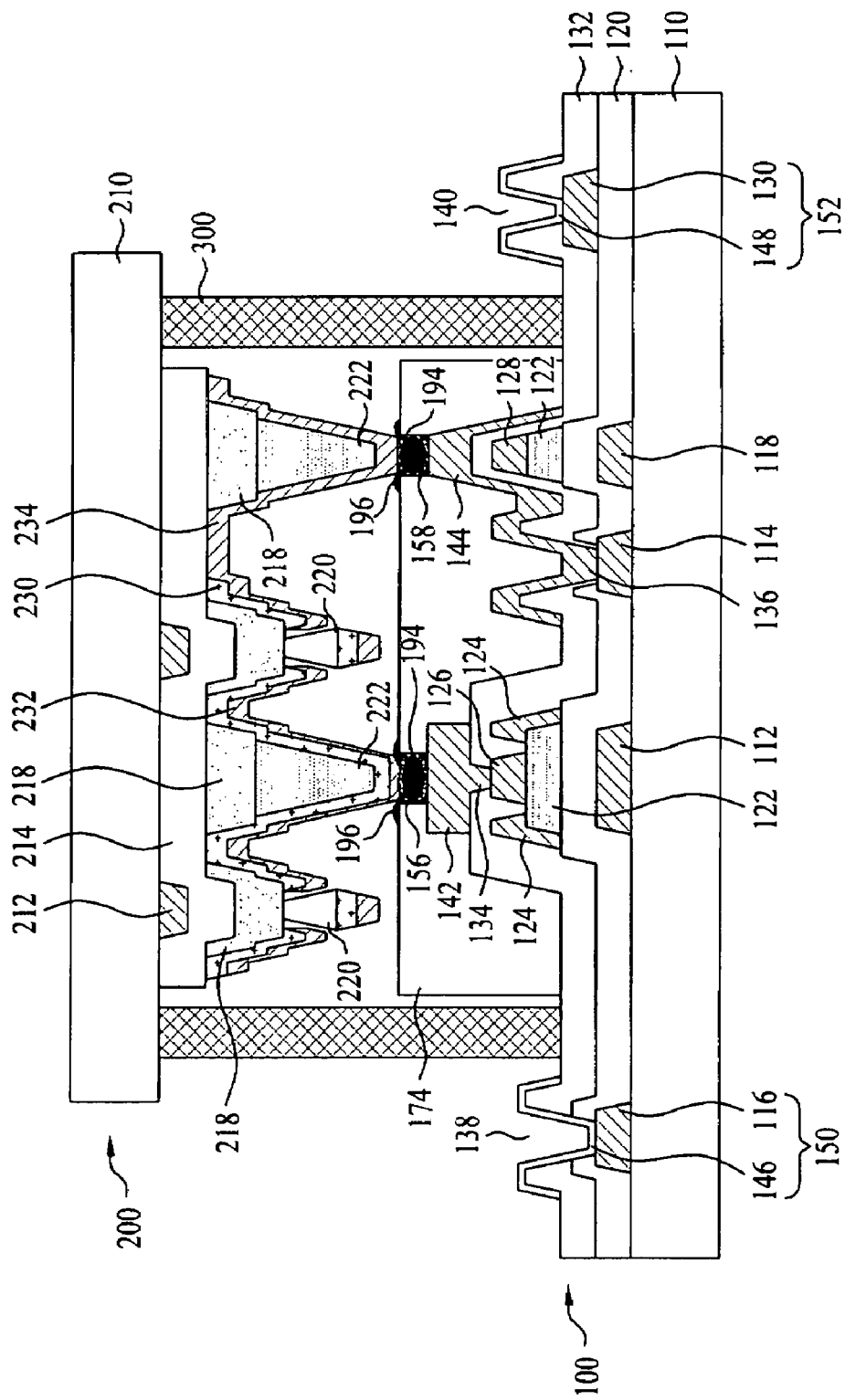
FIG. 6 is a cross section view of illustrating an OLED display device according to the other preferred embodiment of the present invention.

Instead of the conductive ball 184 of FIG. 5, it is possible to use balls 194 which are formed by coating balls of fusible metal with an insulating material. As shown in FIG. 6, a solution including the balls 194 is dropped on the lower substrate 100, and then the lower substrate 100 is swinged, whereby the balls 194 are inserted into the contact holes 156 and 158 of organic insulation layer 154. According as the balls 194 are broken by heat and pressure applied to the upper substrate 100 when bonding the lower and upper substrates 100 and 200 to each other, it causes the outflow of fusible metal from the balls 194. Then, the contact holes 156 and 158 are filled with the fusible metal. In this state, the fusible metal is adhered to the lower and upper substrates irrespective of the ununiform height of contact spacer 222, and is then cured. Through a conductive layer 196 filled in the contact holes 156 and 158, the first contact electrode 142 of lower substrate 100 is electrically connected with the second electrode 232 of upper substrate 200, and the second contact electrode 144 of lower substrate 100 is electrically connected with the third contact electrode 234 of upper substrate 200.

As mentioned above, the OLED display device according to the present invention and the method of fabricating the same have the following advantages.

In the OLED display device according to the present invention, the lower and upper substrates are electrically connected with each other by the conductive film having the elastic properties or the conductive ball. Thus, it is possible to prevent the open defects from occurring, wherein the open defects may occur due to the ununiform height of contact spacer or the externally applied force.

Also, the conductive film includes the getter material which absorbs the moisture or gas, thereby preventing the organic light-emitting layer from being deteriorated.

Also, the OLED display device may use the balls including the fusible metal. Thus, the fusible metal melted by the heat and pressure applied when bonding the lower and upper substrates to each other is cohered to the lower and upper substrates, and is then cured so that it is possible to prevent the open defects caused by the ununiform height of contact spacer or the externally applied force.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An OLED display device comprising:
   a first substrate having formed thereon a sub-pixel driving array;
   a second substrate having formed thereon an OLED array;
   a sealant bonding the first and second substrates to each other; and
   an anisotropic conductive film deformed when bonding the first and second substrates to each other so as to electrically connect the sub-pixel driving array and the OLED array to each other, wherein the anisotropic conductive film is formed on the sub-pixel driving array and includes resin and conductive balls having the deformable property,
   wherein the OLED display device further comprises an organic insulation layer formed between the sub-pixel driving array and the anisotropic film, wherein the organic insulation layer has contact holes to expose predetermined portions of electrodes on the first substrate,
   wherein the conductive balls are inserted into the contact holes and each of the conductive balls is smaller than each of the contact holes.

2. The OLED display device of claim 1, wherein the organic insulation layer is formed inside the sealant and spaced apart from the sealant.

3. The OLED display device of claim 2, wherein the anisotropic conductive film is formed on an entire surface of the organic insulation layer, or is partially formed only on predetermined portions to electrically connect the sub-pixel driving array and the OLED array to each other.

4. The OLED display device of claim 1, wherein the anisotropic conductive film further includes a getter material which absorbs moisture and gas.

5. The OLED display device of claim 1, wherein the sub-pixel driving array comprises a plurality of sub-pixel drivers, each sub-pixel driver comprising:
   at least two thin film transistors; and
   a first contact electrode to electrically connect any one of the at least two thin film transistors with the anisotropic conductive film.

6. The OLED display device of claim 5, wherein the OLED array comprises a plurality of organic light-emitting diodes corresponding to the plurality of sub-pixel drivers, respectively, each organic light-emitting diode comprising:
   a first electrode connected with the first contact electrode of the first substrate via the conductive film;
   a second electrode; and
   an organic light-emitting layer formed between the first and second electrodes.

7. The OLED display device of claim 6, wherein the second electrode is commonly formed in the OLED array,
   wherein the OLED array further comprises:
   a buffer layer formed in a non-emission area of the organic light-emitting layer on the second electrode;
   a separator formed on the buffer layer so as to divide the organic light-emitting layer and the first electrode into sub-pixels; and
   a contact spacer formed on the buffer layer so as to support the first electrode being in contact with the first substrate.

8. The OLED display device of claim 7, wherein the first substrate further comprises:
   a power-supplying line to supply a power signal; and
   a second contact electrode connected with the power-supplying line and the second electrode of the second substrate via the anisotropic conductive film.

9. The OLED display device of claim 8, wherein the second substrate further comprises:
   a third contact electrode to electrically connect the second contact electrode with the second electrode via the anisotropic conductive film,
   wherein the buffer layer and the contact spacer further are formed between the second electrode and the second contact electrode, so as to support the third contact electrode being in contact with the first substrate.

10. The OLED display device of claim 1, wherein the first substrate includes a plurality of pads formed outside the circumference of the sealant.

11. A method of fabricating an OLED display device comprising:
    forming a sub-pixel driving array on a first substrate;
    forming an OLED array on a second substrate;
    forming an anisotropic conductive film on the sub-pixel driving array, wherein the anisotropic conductive film includes resin and conductive balls having deformable property; and
    bonding the first and second substrates to each other by a sealant, and electrically connecting the sub-pixel driving array and the OLED array to each other by the deformed anisotropic conductive film,
    wherein the method further comprises, prior to forming the anisotropic conductive film, forming an organic insulation layer on the sub-pixel driving array and forming contact holes in the organic insulation layer to expose predetermined portion of the electrodes in sub-pixel driving array, and
    wherein the conductive balls are inserted into the contact holes and each of the conductive balls is smaller than each of the contact holes.

12. The method of claim 11, wherein the organic insulation layer is formed inside the sealant and spaced apart from the sealant.

13. The method of claim 11, wherein the anisotropic conductive film further includes a getter material which absorbs moisture and gas.

14. The method of claim 11, wherein the anisotropic conductive film is formed on an entire surface of the organic insulation layer, or is partially formed only on a predetermined portion to electrically connect the sub-pixel driving array and the OLED array to each other.

15. The method of claim 11, wherein forming the sub-pixel driving array on the first substrate includes forming a plurality of sub-pixel drivers and signal lines,
    wherein each sub-pixel driver includes at least two thin film transistors, and a first contact electrode to electrically connect any one of the at least two thin film transistors with the anisotropic conductive film.

16. The method of claim 15, wherein forming the OLED array on the second substrate includes forming a plurality of organic light-emitting diodes, wherein each organic light-emitting diode comprises a first electrode connected with the first contact electrode via the anisotropic conductive film, a second electrode, and an organic light-emitting layer between the first and second electrodes.

17. The method of claim 16, wherein the second electrode is commonly formed in the OLED array, and
forming the OLED array comprises:
forming a buffer layer in a non-emission area of the organic light-emitting layer on the second electrode;
forming a separator on the buffer layer so as to divide the organic light-emitting layer and the first electrode into sub-pixels; and
forming a contact spacer on the buffer layer so as to support the first electrode being in contact with the first substrate via the anisotropic conductive film.

18. The method of claim 17, further comprising:
forming a power-supplying line to supply a power signal to the first substrate; and
forming a second contact electrode electrically connected with the power-supplying line and the second electrode of the second substrate via the anisotropic conductive film.

19. The method of claim 18, further comprising:
forming a third contact electrode connected with the second electrode on the second substrate,
wherein the buffer layer and the contact spacer further are formed between the second electrode and the second contact electrode, so as to electrically connect the third contact electrode with the sub-pixel driving array.

* * * * *